United States Patent
Huston et al.

(10) Patent No.: US 10,585,518 B2
(45) Date of Patent: Mar. 10, 2020

(54) DISPLAY MODULE SUPPORT

(71) Applicant: Microsoft Technology Licensing, LLC, Redmond, WA (US)

(72) Inventors: David J. Huston, Seattle, WA (US); James Michael Bonicatto, Seattle, WA (US); Kenneth Charles Boman, Duvall, WA (US); Andrew William Hill, Redmond, WA (US); John Stephen Campbell, Spanaway, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 133 days.

(21) Appl. No.: 14/515,242

(22) Filed: Oct. 15, 2014

(65) Prior Publication Data
US 2016/0110004 A1    Apr. 21, 2016

(51) Int. Cl.
*G06F 3/041* (2006.01)
*G06F 1/16* (2006.01)
*H05K 5/00* (2006.01)

(52) U.S. Cl.
CPC .......... *G06F 3/0414* (2013.01); *G06F 1/1607* (2013.01); *H05K 5/00* (2013.01); *H05K 5/0017* (2013.01)

(58) Field of Classification Search
CPC ...... G06F 1/1626; H05K 5/00; H05K 5/0004; H05K 5/0017; H05K 5/06
See application file for complete search history.

(56) References Cited

U.S. PATENT DOCUMENTS

| | | | |
|---|---|---|---|
| 8,062,475 B2 | 11/2011 | Masuda et al. | |
| 8,692,948 B2 | 4/2014 | Park et al. | |
| 2002/0064885 A1* | 5/2002 | Bedingham | B01L 3/5025 436/174 |
| 2002/0071375 A1* | 6/2002 | Takahashi | G11B 17/046 720/726 |
| 2002/0154476 A1* | 10/2002 | Cho | G06F 1/1616 361/679.27 |

(Continued)

FOREIGN PATENT DOCUMENTS

| | | |
|---|---|---|
| CN | 101069008 A | 1/2008 |
| CN | 101263444 A | 9/2008 |

(Continued)

OTHER PUBLICATIONS

"International Search Report and Written Opinion", Application No. PCT/US2015/055190, dated Jan. 11, 2016, 10 Pages.

(Continued)

*Primary Examiner* — Kent W Chang
*Assistant Examiner* — Sujit Shah
(74) *Attorney, Agent, or Firm* — Rainier Patents, P.S.

(57) ABSTRACT

Display module support techniques are described. In one or more implementations, an apparatus includes an external enclosure forming a cavity and a touch display module. The touch display module includes a touch panel assembly having one or more touch sensors and a display module to output a display through at least a portion of the touch panel assembly. The apparatus also includes a support that secures the touch display module to the external enclosure. The support is secured to the external enclosure using a reworkable connection.

20 Claims, 8 Drawing Sheets

(56) References Cited

U.S. PATENT DOCUMENTS

| | | | |
|---|---|---|---|
| 2007/0059520 A1* | 3/2007 | Hatin | G06F 3/0412 |
| | | | 428/343 |
| 2008/0137272 A1 | 6/2008 | Cheng et al. | |
| 2009/0225507 A1* | 9/2009 | Sato | H05K 7/20963 |
| | | | 361/679.21 |
| 2009/0257189 A1* | 10/2009 | Wang | H04M 1/0249 |
| | | | 361/679.56 |
| 2009/0257207 A1* | 10/2009 | Wang | G06F 1/1626 |
| | | | 361/752 |
| 2010/0090977 A1* | 4/2010 | Shih | G06F 1/1626 |
| | | | 345/174 |
| 2011/0075342 A1* | 3/2011 | Gotham | H05K 5/02 |
| | | | 361/679.21 |
| 2011/0115744 A1* | 5/2011 | Murayama | G06F 3/0414 |
| | | | 345/174 |
| 2011/0181543 A1* | 7/2011 | Long | G06F 3/044 |
| | | | 345/174 |
| 2011/0181545 A1* | 7/2011 | Takahashi | G06F 3/041 |
| | | | 345/174 |
| 2011/0260960 A1* | 10/2011 | Jean | H04N 5/64 |
| | | | 345/102 |
| 2012/0236482 A1 | 9/2012 | Lin et al. | |
| 2013/0069497 A1 | 3/2013 | Choi et al. | |
| 2013/0222298 A1* | 8/2013 | Kato | G06F 3/01 |
| | | | 345/173 |
| 2013/0223917 A1 | 8/2013 | Melgaard | |
| 2013/0229366 A1* | 9/2013 | Dighde | G06F 3/041 |
| | | | 345/173 |
| 2013/0280464 A1 | 10/2013 | Noni, Jr. | |
| 2013/0331150 A1* | 12/2013 | Butsusaka | H04B 1/3888 |
| | | | 455/566 |
| 2014/0091336 A1 | 4/2014 | Sanford et al. | |
| 2014/0118985 A1 | 5/2014 | Hassember | |
| 2015/0077909 A1* | 3/2015 | Filiz | G06F 1/1637 |
| | | | 361/679.01 |
| 2015/0153829 A1* | 6/2015 | Shiraishi | G06F 1/1626 |
| | | | 345/173 |
| 2015/0198976 A1* | 7/2015 | Raff | G06F 1/1637 |
| | | | 361/679.3 |
| 2015/0222735 A1* | 8/2015 | Tanaka | G02F 1/133308 |
| | | | 455/566 |

FOREIGN PATENT DOCUMENTS

| | | |
|---|---|---|
| CN | 201122216 Y | 9/2008 |
| CN | 101498980 A | 8/2009 |
| CN | 102171300 A | 8/2011 |
| JP | H11305683 A | 11/1999 |
| JP | 2007127772 A | 5/2007 |
| JP | 2008115320 A | 5/2008 |
| JP | 2012216141 A | 11/2012 |
| JP | 2013080364 A | 5/2013 |
| JP | 2014013347 A | 1/2014 |
| JP | 2014153941 A | 8/2014 |
| WO | WO-2013141167 | 9/2013 |
| WO | WO-2014107292 | 7/2014 |

OTHER PUBLICATIONS

"Color & Comfort by Chemistry", Retrieved From: <http://www.dic-global.com/en/whats_dic/scene/smartphone/> Jul. 31, 2014, Sep. 26, 2013, 4 pages.

"Office Action Issued in European Patent Application No. 15788254.9", dated Feb. 12, 2018, 3 Pages.

"International Preliminary Report on Patentability Issued in PCT Application No. PCT/US2015/055190", dated Oct. 14, 2016, 6 Pages.

"Summons to Attend Oral Proceedings Issued in European Patent Application No. 15788254.9", Mailed Date: Apr. 25, 2019, 6 Pages.

"Office Action Issued in Japanese Patent Application No. 2017-519854", dated Jun. 11, 2019, 10 Pages.

"First Office Action and Search Report Issued in Chinese Patent Application No. 201580056347.0", dated Jul. 3, 2019, 18 Pages.

"Office Action Issued in European Patent Application No. 15788254.9", dated Jul. 25, 2018, 6 Pages.

"Notice of Allowance Issued in Japanese Patent Application No. 2017-519854", dated Oct. 29, 2019, 5 Pages.

\* cited by examiner

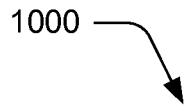

1000

1002
Receive an apparatus that includes a support and a touch display module having a touch panel assembly having one or more touch sensors and a display module to output a display through at least a portion of the touch panel assembly, the support secured to the touch display module using a connection that is not reworkable 1004
Secure the support of the apparatus within a cavity of an external enclosure using a reworkable connection

*Fig. 10*

DISPLAY MODULE SUPPORT

BACKGROUND

Mobile computing devices may be found in a variety of form factors, such as a tablet, a mobile communications device (e.g., a phone), and so forth. As these form factors are optimized for mobile use, a size of the device becomes a primary consideration in its design and implementation. For example, manufacturers continually strive to develop ever smaller form factors having a maximized display area to increase efficiency and portability of the device.

Conventional techniques that are utilized to manufacture these mobile computing devices, however, may limit a size of the devices. For example, touch display modules may be one of the most expensive pieces of a mobile computing device. As such, the mobile computing device may be designed to support removal of the touch display module, such as to recycle these modules in a case of failure of a mobile computing device in testing after manufacture. These conventional techniques, however, may result in a large bezel area surrounding the touch display module, therefore adding undesired size to the mobile computing device.

SUMMARY

Display module support techniques are described. In one or more implementations, an apparatus includes an external enclosure forming a cavity and a touch display module. The touch display module includes a touch panel assembly having one or more touch sensors and a display module to output a display through at least a portion of the touch panel assembly. The apparatus also includes a support that secures the touch display module to the external enclosure. The support is secured to the external enclosure using a reworkable connection.

In one or more implementations, a computing device includes an external enclosure forming a cavity and supporting a handheld configuration, a touch display module, a support, and one or more hardware components. The touch display module includes a touch panel assembly having one or more touch sensors and a display module to output a display through at least a portion of the touch panel assembly. The support secures the touch display module to the external enclosure. The support is secured to the external enclosure using a reworkable connection and secured to the touch display module using a connection that is not reworkable. The one or more hardware components are disposed within the housing and configured to cause output of a user interface by the display module.

In one or more implementations, an apparatus is received that includes a support and a touch display module. The touch display module includes a touch panel assembly having one or more touch sensors and a display module to output a display through at least a portion of the touch panel assembly. The support is secured to the touch display module using a connection that is not reworkable. The support of the apparatus is then secured within a cavity of an external enclosure using a reworkable connection.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 10 depicts a procedure in an example implementation in which an apparatus that includes a touch display module and a support is assembled within an external enclosure as part of manufacture of a computing device.

DETAILED DESCRIPTION

Overview

A size of a bezel of a display device is one of the challenges in making mobile computing devices and well as other devices and even dedicated display devices smaller. Conventional techniques to manufacture these devices, for instance, may employ the bezel to support a reworkable connection such that should the device need repair, fail testing during manufacture, replacement of a battery, and so on a touch display module of the device may be removed, which is one of the most expensive pieces involved in manufacture of the computing device. However, this conventional reworkable connection resulted in an increased size of the bezel, such as due to conventional limitations in a bonding strength of the reworkable connection, thereby limiting a size of a touch display module that may be used with an external enclosure (e.g., external housing) of the computing device.

Touch display module support techniques are described. In one or more implementations, a support may be configured as a ring that at least partially surrounds a touch display module. The support is connected to the touch display module using a connection that is not reworkable, such as through use of a permanent pressure sensitive adhesive. In this way, the support may act to protect the touch display module, e.g., during shipping.

The support is also configured to be secured to an external enclosure of a computing device, e.g., a housing of a mobile phone, tablet, and so on. The support may be connected using a reworkable connection that is configured to support removal from the external enclosure, e.g., through use of a reworkable pressure sensitive adhesive that is configured to be released by applying heat to the adhesive. A reworkable connection is a connection that may be released without damaging components, such as through heat, mechanical attachment, and so on. The support, for instance, may have a first opposing side that includes the connection that is not reworkable and a second opposing side that includes the connection that is reworkable. The second opposing side may be configured to have a greater surface area than the first opposing side, and thus may enable use of the reworkable pressure sensitive adhesive that has less bonding strength than the permanent pressure sensitive adhesive. In this way, a size of a bezel disposed adjacent to the touch display module may be reduced. Further discussion of these and other examples may be found in relation to the following sections.

In the following discussion, an example environment is first described that may employ the techniques described herein. Example procedures are then described which may be performed in the example environment as well as other environments. Consequently, performance of the example procedures is not limited to the example environment and the example environment is not limited to performance of the example procedures.

Example Environment

Figure 1:
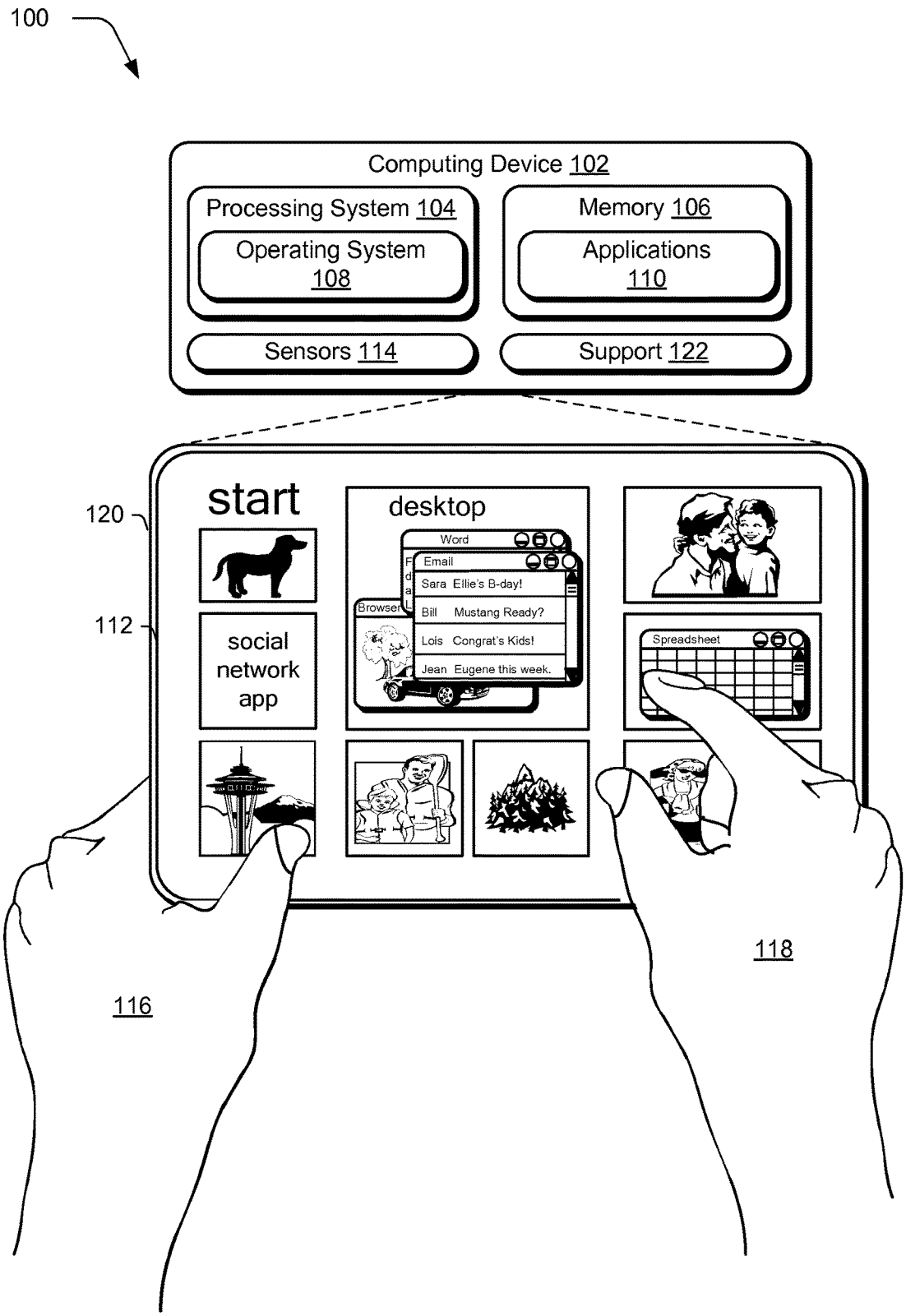
FIG. 1 is an illustration of an environment in an example implementation that is operable to employ a display device utilizing the touch display module support techniques described herein.

FIG. 1 is an illustration of an environment 100 in an example implementation that is operable to employ support techniques described herein. The illustrated environment 100 includes a computing device 102 having one or more hardware components, examples of which include a processing system 104 and a computer-readable storage medium that is illustrated as a memory 106 although other components are also contemplated as further described below.

The computing device 102 may be configured in a variety of ways. For example, a computing device may be configured as a computer that is capable of communicating over a network, such as a desktop computer, a mobile station, an entertainment appliance, a set-top box communicatively coupled to a display device, a wireless phone, a game console, educational interactive devices, point of sales devices, and so forth. Thus, the computing device 102 may range from full resource devices with substantial memory and processor resources (e.g., personal computers, game consoles) to a low-resource device with limited memory and/or processing resources (e.g., traditional set-top boxes, hand-held game consoles). Additionally, although a single computing device 102 is shown, the computing device 102 may be representative of a plurality of different devices, such as multiple servers utilized by a business to perform operations such as by a web service, a remote control and set-top box combination, an image capture device and a game console configured to capture gestures, and so on. In addition, it may apply to apparatuses including a plurality of display devices, e.g., a clam shell configuration.

The computing device 102 is further illustrated as including an operating system 108, although other embodiments are also contemplated in which an operating system is not employed. The operating system 108 is configured to abstract underlying functionality of the computing device 102 to applications 110 that are executable on the computing device 102. For example, the operating system 108 may abstract the processing system 104, memory 106, network, and/or touch display module 112 functionality of the computing device 102 such that the applications 110 may be written without knowing "how" this underlying functionality is implemented. The application 110, for instance, may provide data to the operating system 108 to be rendered and displayed by the touch display module 112 without understanding how this rendering will be performed. The operating system 108 may also represent a variety of other functionality, such as to manage a file system and user interface that is navigable by a user of the computing device 102.

The computing device 102 may support a variety of different interactions. For example, the computing device 102 may include one or more hardware devices that are easily manipulated by a user to interact with the device, such as a keyboard, cursor control device (e.g., mouse), and so on. The computing device 102 may also support gestures, which may be detected in a variety of ways. The computing device 102, for instance, may support touch gestures that are detected using touch panel functionality of the touch display module 112 of the computing device 102.

The sensors 114, for instance, may be configured to provide touch panel functionality as part of the touch display module 112. The sensors 114, for instance, may be configured as capacitive, resistive, acoustic, light (e.g., sensor in a pixel), and so on that are configured to detect proximity of an object. An example of this is illustrated in FIG. 1 in which first and second hands 116, 118 of a user are illustrated. The first hand 116 of the user is shown as holding an external enclosure 120 (e.g., housing) of the computing device 102. The second hand 118 of the user is illustrated as providing one or more inputs that are detected using touch panel functionality of the touch display module 112 to perform an operation, such as to make a swipe gesture to pan through representations of applications in the start menu of the operating system 108 as illustrated. This may also apply to user input with an active or passive stylus.

The computing device 102 is also illustrated as including a support 122. The support may be configured to reduce an even eliminate an amount of space disposed between the touch display module 112 and the external enclosure 120 and thus reduce a size of a bezel of the touch display module 112. This may be performed by movement of a location of a reworkable connection through use of the support 122 that is utilized to separate the touch display module 112 from the external enclosure 120. In this way, a size of a bezel may be reduced to support form factors that have increased efficiency along with increase a strength of a connection between the touch display module 112 and the external enclosure, further discussion of which may be found in the following description and is shown in corresponding figures.

Figure 2:
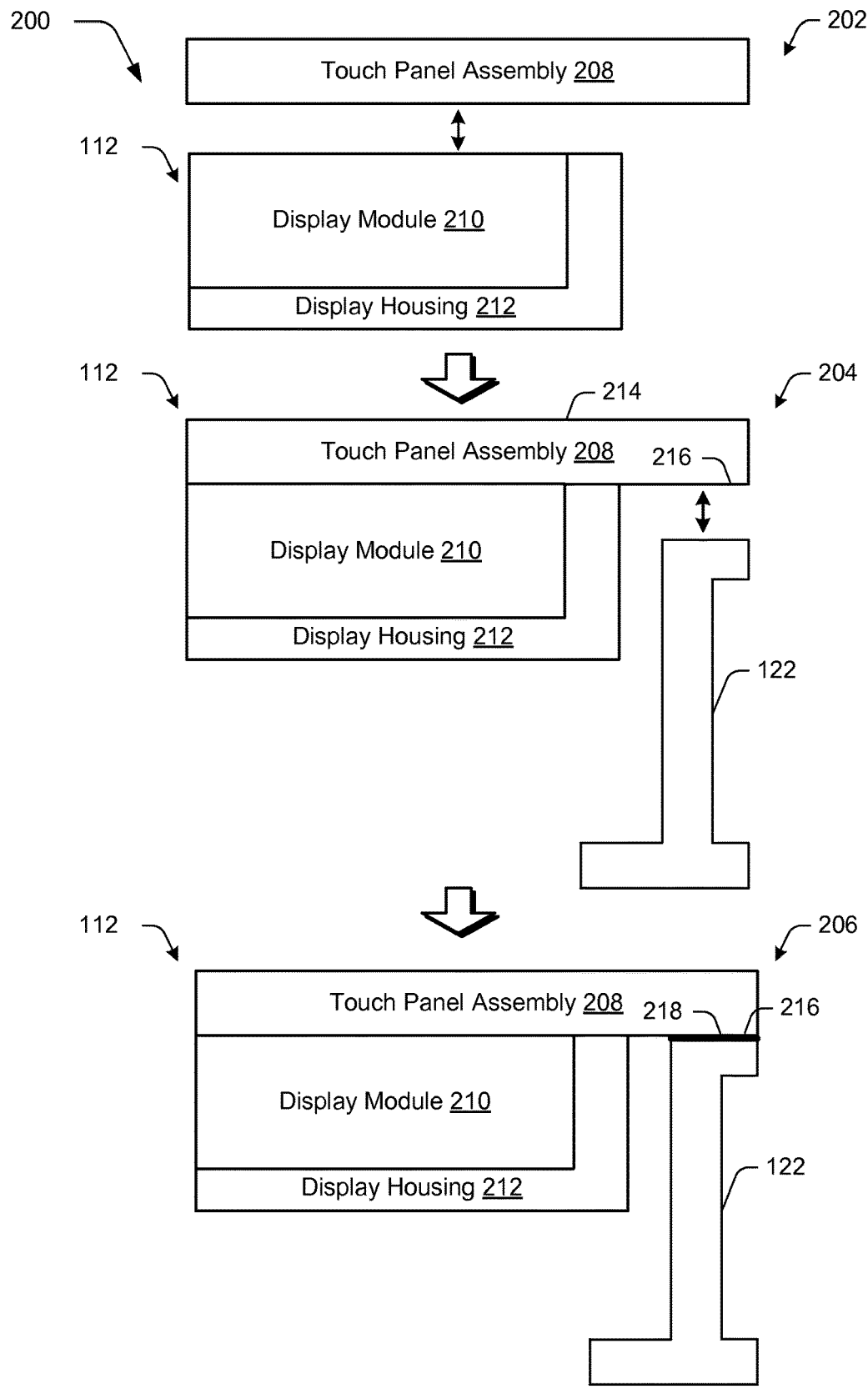
FIG. 2 depicts a system in an example implementation in which manufacture of a touch display module of FIG. 1 is shown.

FIG. 2 depicts a system 200 in an example implementation in which manufacture of a touch display module 112 is shown. This system 200 illustrates manufacture of the touch display module 112 using first, second, and third stages 202, 204, 206. At the first stage 202, the touch display module 112 is formed by optically bonding a touch panel assembly 208 to a display module 210 having a display housing 212. The touch panel assembly 208 is configured to support touch functionality, such as through use of one or more sensors 114 as described in relation to FIG. 1 to detect proximity of an object.

The display module 210 is illustrated as secured within a display housing 212. The display module 210 may be configured in a variety of different ways, such as a liquid crystal display (LCD) module, an organic light emitting diode (OLED) module, and so on. The display housing 212 is configured to secure components of the display module 210 together, an example of which is shown and described in relation to FIG. 5.

As the second stage 204, the touch panel assembly 208 is disposed proximal to a support 122. For example, the touch panel assembly 202 may define an outer surface 214 via which proximity of an object may be detected and through which a display output by the display module 210 may be viewed. The support 122 is positioned at a side 216 of the touch panel assembly 208 that is opposite from that of the outer surface 214. The support 122 may be configured in a variety of ways, such as in a ring shape that substantially surrounds the display module 210 of the touch display module 112.

At the third stage 206, the touch display module 112 is connected to the support 122 using a connection 218 that is not reworkable, e.g., an attempt at removal is likely to break parts of the touch display module 112. For example, the connection 218 may be formed using a permanent pressure sensitive adhesive such that a relatively permanent bond is formed between the support 122 and the touch panel assembly 208. It should be noted that as illustrated the support 122 is secured to the touch panel assembly 208 using the connection 216 such that the display module 210 may "hang" from the touch panel assembly 208. In this way, a likelihood of introducing artifacts may be reduced, e.g., through stresses introduced during manufacture, during usage in response to contact from a user, and so on. Further, through formation of the support 122 to at least partially surround the display module 210, the support 122 may be configured to protect the display module 210, e.g., during shipping. For example, the support 122 may be secured to the touch display module 112 by a manufacturer of the touch display module 112 and then ship the module to a computing device manufacturer for assembly, thereby protecting the touch display module 112 during shipping and assembly.

Thus, at this point the support 122 is secured to the touch panel assembly 208 of the touch display module 112 through use of a connection that is not reworkable. Therefore, the connection 216 may be formed that has an increased bonding strength over previous connections that were reworkable, which thus supports use of a decreased surface area in making the connection. In the illustrated example, for instance, the support 122 is bonded to an underside of the touch panel assembly 208 and does not extend past the outer surface 214 of the touch panel assembly 208, thereby reducing a size of a bezel disposed outside of the display module 210 and between an external enclosure, further discussion of which may be found in the following and is shown in a corresponding figure.

Figure 3:
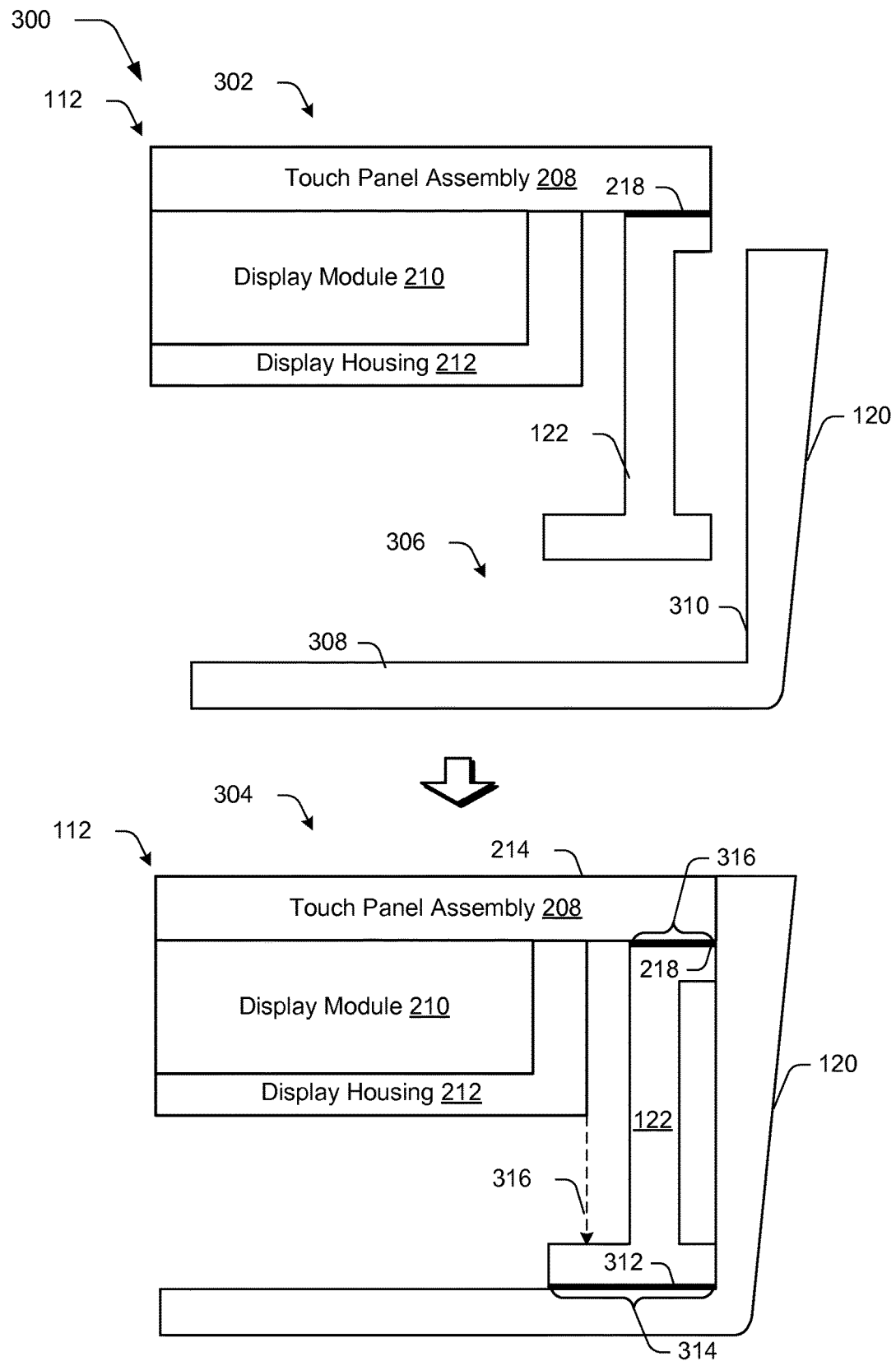
FIG. 3 depicts a system in an example implementation in which connection of a touch display module of FIG. 2 to an external enclosure is shown as part of manufacture of the computing device of FIG. 1.

FIG. 3 depicts a system 300 in an example implementation in which connection of the touch display module 112 of FIG. 2 to an external enclosure 120 is shown as part of manufacture of the computing device 102 of FIG. 1. This system 300 illustrates the connection using first and second stages 302, 304. At the first stage 302, an apparatus of FIG. 2 that includes the touch panel module 112 having the support 122 secured thereto is disposed within a cavity formed by an external enclosure 306. The external enclosure 306, for instance, may include a bottom surface 308 and a sidewall 310 that forms a cavity as a "bucket" in which hardware components of the computing device 102 may be disposed, such as the processing system 104, memory 106, and so on.

At the second stage 304, the support 122 is secured to the external enclosure 120 using a connection 312 that is reworkable. The connection 312, for instance, may be formed using an adhesive that is configured to be released by applying heat to the external enclosure 120, e.g., a reworkable pressure sensitive adhesive. In this way, the connection 312 may permit separation of the touch display module 112 from the external enclosure 120 without damaging components of the touch display module 112.

As previously described, a reworkable adhesive may have less bonding force when applied than a permanent adhesive. As such, a surface area 314 utilized in forming the connection 312 that is reworkable may be greater than a surface area 316 used to form the connection 218 that is not reworkable. Conventionally, this could cause an increase in a size of a bezel between the display module 210 and the external enclosure 120 as previously described. However, by moving the connection that is reworkable away from the touch display module 112, a desired surface area 314 may still be utilized, such as to leverage an amount of space 316 available beneath the display module 210 without contacting the display module.

Figure 4:
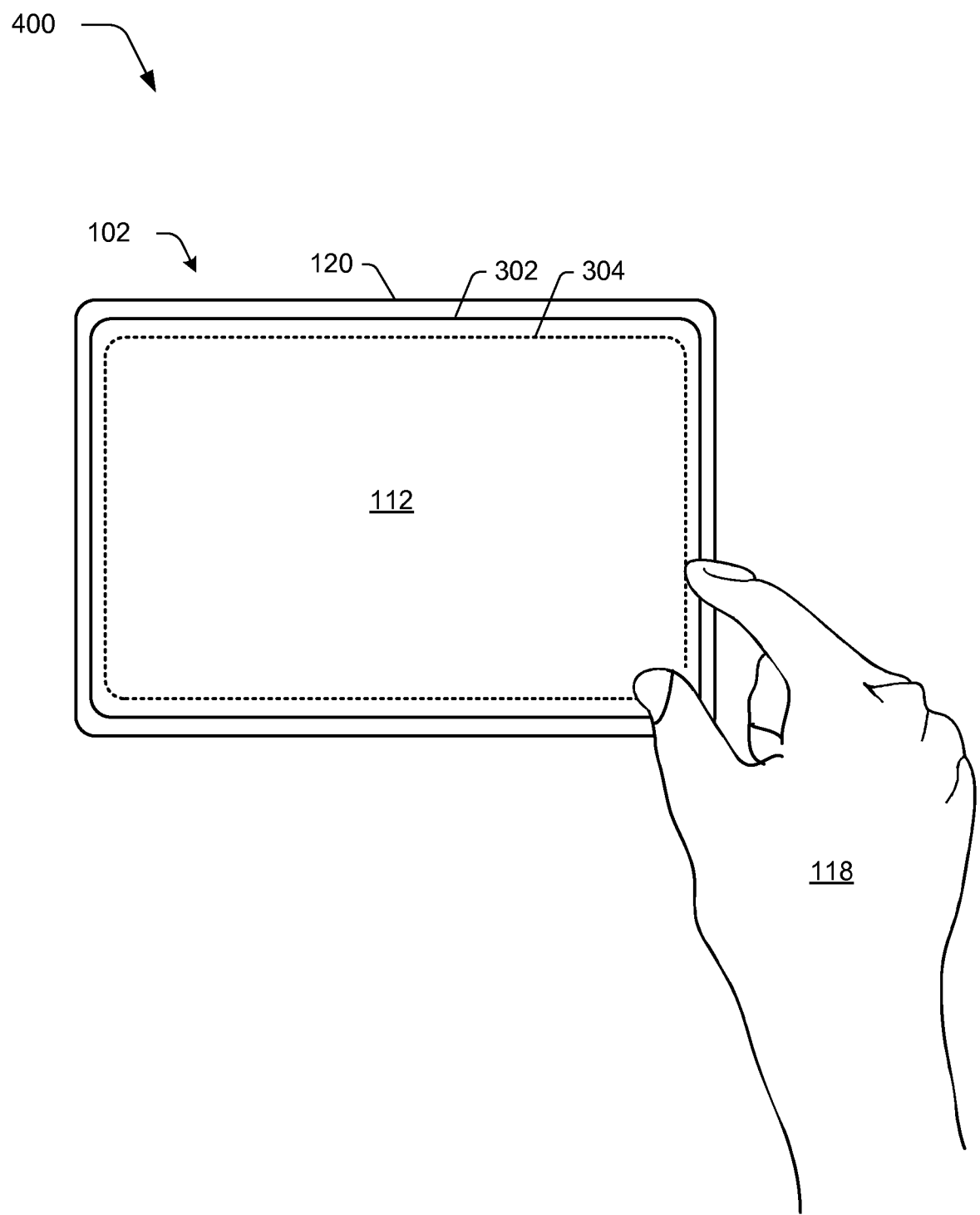
FIG. 4 depicts a system in which a top view of the computing device of FIG. 1 incorporates the touch display module of FIG. 3.

For example, a system 400 in shown in FIG. 4 in which a top view of the computing device 102 of FIG. 1 incorporates the touch display module 112 of FIG. 3. An inner edge of the external enclosure 120 is illustrated as defining a first perimeter 302. The display housing 212 is disposed within the cavity 306 of the external enclosure 120 of FIG. 3. As such, an edge along the display housing 206 may be used to define a second perimeter 304. The support 122 of FIG. 3 may therefore be secured to the touch display module 112 between the first and second perimeters 302, 304 using the connection 218 that is not reworkable.

The support 122 of FIG. 3 may also be secured to the external enclosure 120 using the connection 312 that is reworkable. Further, this connection 312 may leverage an area between the first and second perimeters 302, 304 as well as an amount of space 316 within the second perimeter 304 that is beneath the display module 210 as shown in FIG. 3. Thus, a size of a bezel along a surface of the touch display module 112 that is formed between the first and second perimeters 302, 304 may be reduced.

Additionally, this may reduce residual stress may develop as part of the manufacturing process because of the use different materials in an optical bonded display bonding stack, such as a stack that includes the touch panel assembly 208, display module 210, and display housing 212. This may also reduce applied stresses resulting from the assembly of the bonded devices to the external enclosure 120, such as in thin devices formed to support a hand held form factor.

Further, some display modules may be configured to support wide-angle viewing, such as plane switching, plane line switching, and so on. However, such devices may have increased sensitivity to applied and residual pressures, e.g., stresses. For example, these pressures may change a polarization of embedded liquid crystals and therefore cause visual effects that are viewable by a user of the touch display module 112, such as light leakage, different color bands, edge pooling, and so forth. These visual effects may be amplified along the edges, e.g., one or more of the perimeters previously described due to applied stress resulting from assembly of components in thin devices. These defects may have a significant impact on a user's experience with the touch display module 112 and product reliability. Conventional resolution of this issue involved reconstruction of the display module, which can be prohibitively expensive and may be unable to address the assembly caused stresses.

Accordingly, use of the support 122 along with the touch display module 112 may be used to reduce and even eliminate these issues. These techniques may include an assembly construction approach, method and materials to solve these issues. For example, the support 122 as shown in FIG. 3 may be used to remove unsupported areas in the assembly of bonded displays in the external enclosure 120. In this way, the support 122 may also improve visibility and use of the touch display module 112.

Figure 5:
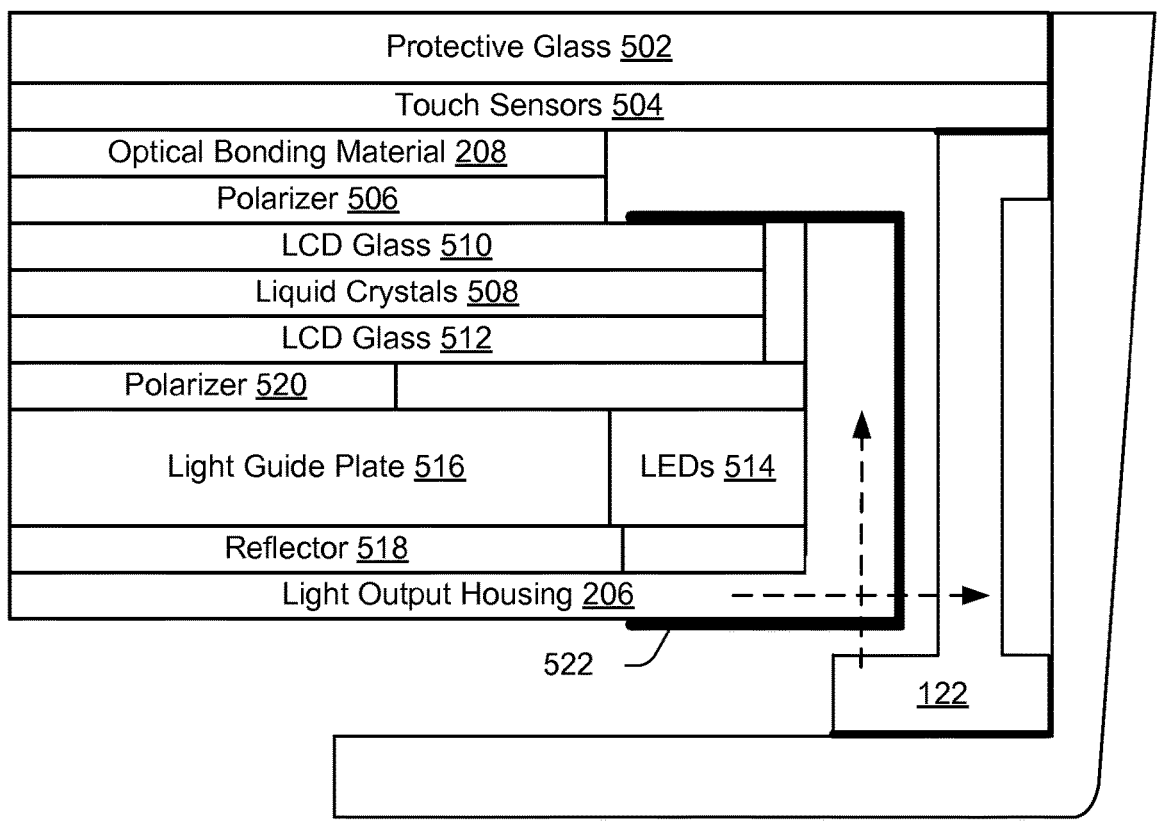
FIG. 5 depicts a system showing an example of the touch panel assembly and display module of the touch display module of FIG. 4 in greater detail.

FIG. 5 depicts a system 500 showing an example of the touch panel assembly 208 and display module 210 of the touch display module 112 in greater detail. In this example, the touch panel assembly 208 is formed using a protective glass 502 and touch sensors 504. As before, the touch sensors 504 may assume a variety of configurations, the illustrated example being capacitive but other examples are also contemplated.

The display module 210 includes a polarizer 506 and liquid crystals 508 disposed between two sheets of LCD glass 510, 512. In the illustrated example, an edge lit configuration is shown in which LEDs 514 project light into a light guide plate 516 and employs a reflector 518 to cause the light to pass through a polarizer 520 and through the light crystals 508 described previously.

Components of the display module 210 are disposed within a display housing 212 as shown in FIG. 2. In the illustrated example of FIG. 5, the components are secured to the housing using tape 522, although other examples are also contemplated. As previously described, pressures may be encountered during manufacture of these components. Examples of this are illustrated using phantom arrows showing pressure of the display housing 212 against a side of the external enclosure 120 as well as pressures caused by flexing of the components during installation in the external enclosure 120. Accordingly, the support 122 may be positioned to reduce and even eliminate compressive stresses as described above. Although use of an LCD module is shown, other examples of display device modules are also contemplated. Further, the support 122 may be configured in a variety of different ways, examples of which may be found in the following and are shown in corresponding figures.

Figure 6:
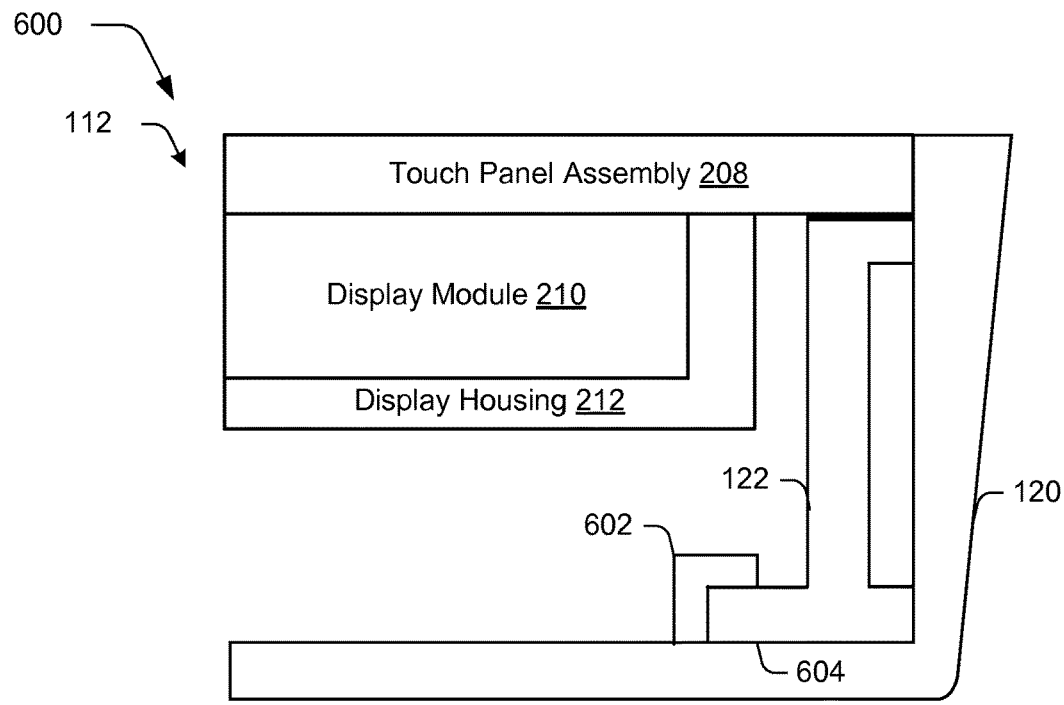
FIG. 6 depicts an example implementation showing another configuration of a connection that is reworkable.

FIG. 6 depicts an example implementation 600 showing another configuration of a connection that is reworkable. In this example, the external enclosure 120 includes a mechanical attachment 602 that is configured to snap over a foot 604 formed by the support 122. A reverse of this arrangement may also be supported. In this way, the apparatus that includes the touch display module 112 and the support 122 may be "snapped into" the external enclosure 120. Further, a retention force of the mechanical attachment 602 may be configured to permit removal of the touch display module 112 from the external enclosure 120 without damage to the touch display module 112, and is thus reworkable.

Figure 7:
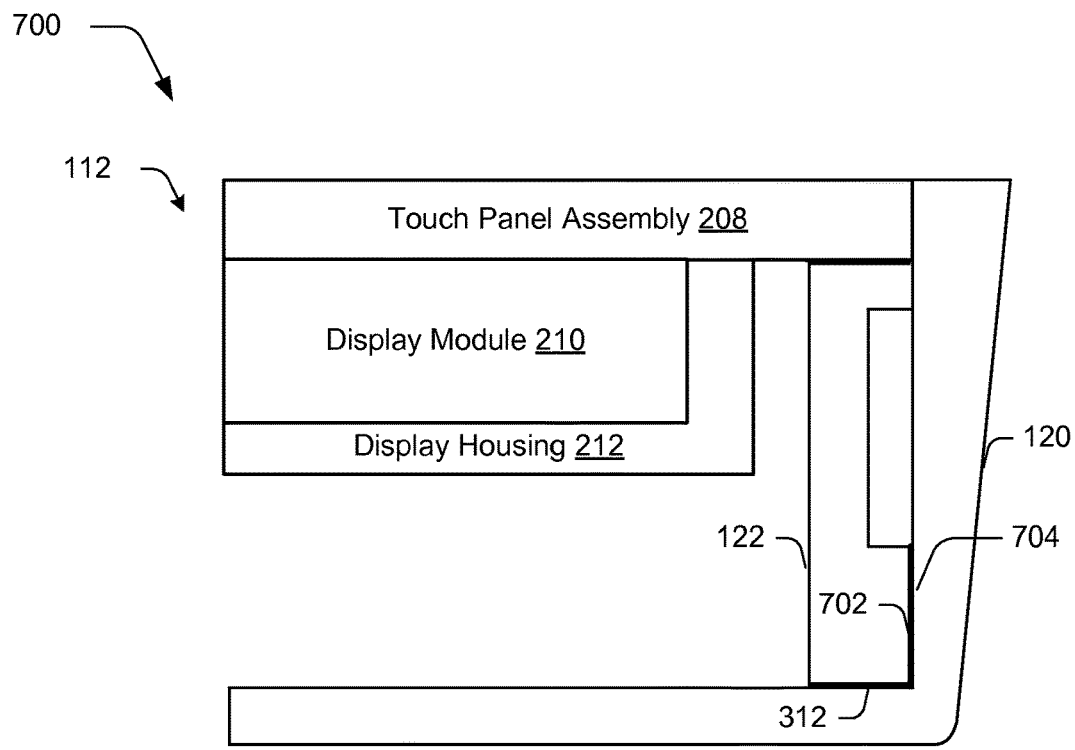
FIG. 7 depicts an example implementation showing a further configuration of a connection that is reworkable.

FIG. 7 depicts an example implementation 700 showing a further configuration of a connection that is reworkable. In the previous example shown in FIG. 3, the support 122 includes opposing ends, a first of which is secured to the touch panel assembly 208 and a second of which is secured via a connection 312 to the external enclosure 120. Other configurations are also contemplated, such as to use a reworkable adhesive 702 along a side 704 of the external enclosure 120, which may be performed in addition to or in place of the connection 312.

Figure 8:
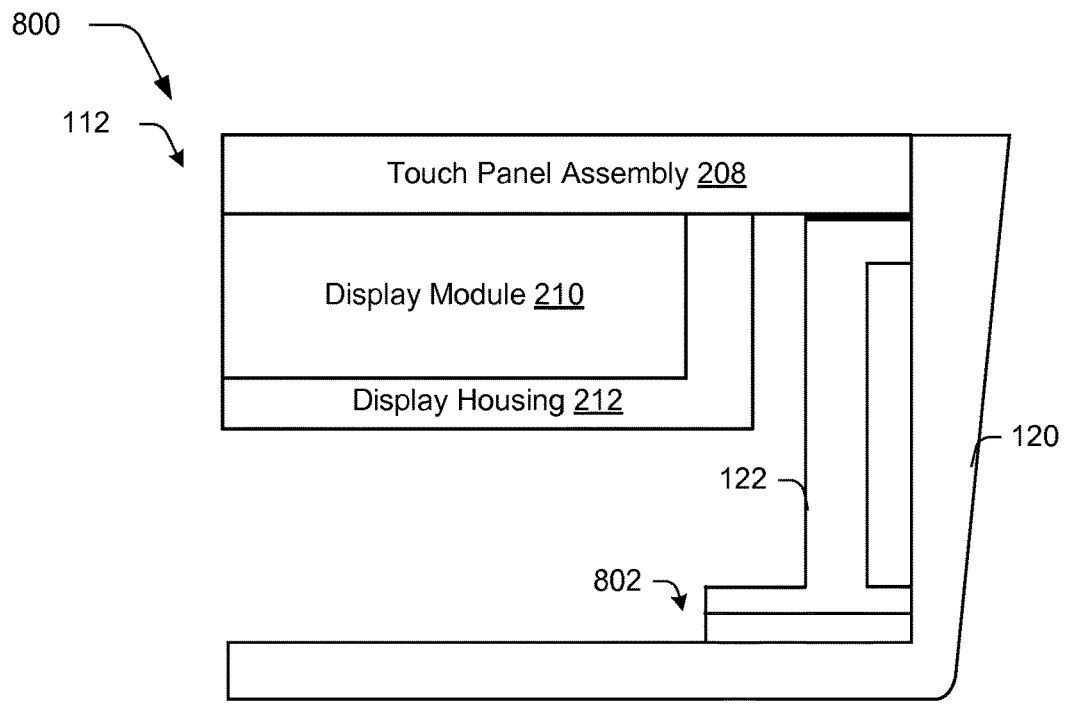
FIG. 8 depicts an example implementation showing yet another configuration of a connection that is reworkable.

FIG. 8 depicts an example implementation 800 showing yet another configuration of a connection that is reworkable. In this example the reworkable connection is formed using a magnetic connection 802, which may be achieved through use of magnets by the support 122 and/or the external chassis 120, e.g., flux fountains, rare-earth magnets, and so on. Thus, magnetism may be utilized to support the reworkable connection.

Figure 9:
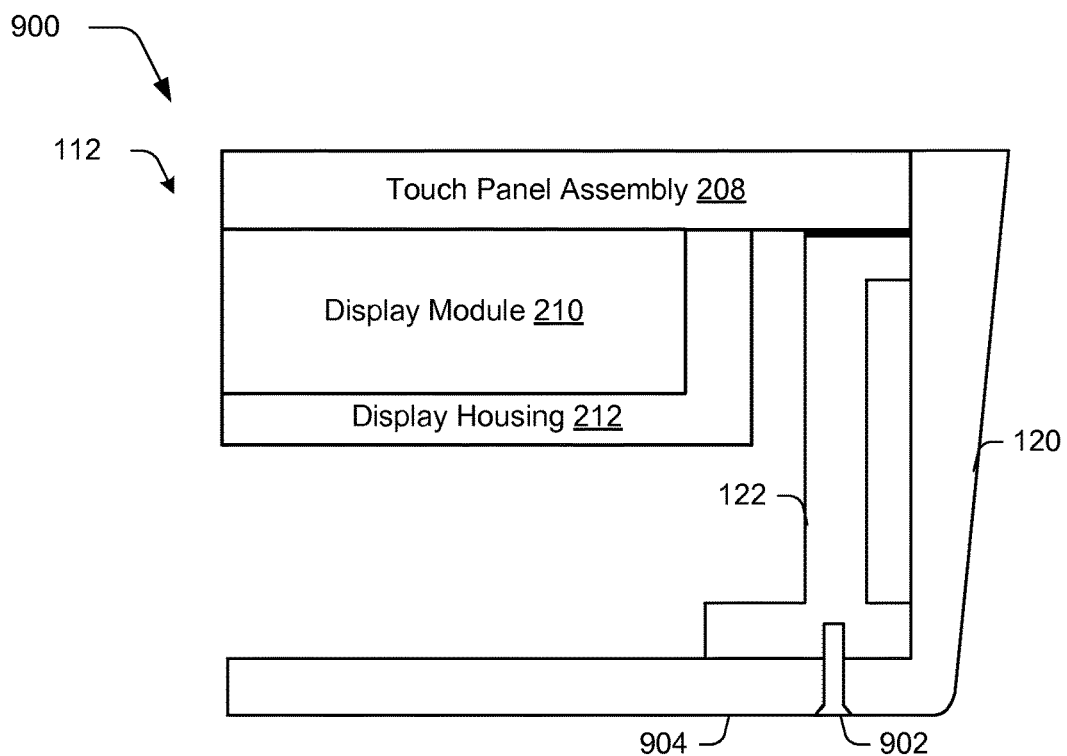
FIG. 9 depicts an example implementation showing still yet another configuration of a connection that is reworkable.

FIG. 9 depicts an example implementation 900 showing still yet another configuration of a connection that is reworkable. In this example, a mechanical reworkable connection 902 is illustrated that is achieved through the use of a screw or other mechanical device this is accessible via an external side 904 of the external enclosure 120. Thus, reworkable connections may utilize a variety of configurations so support removal of the touch display panel 122 from the external enclosure 120 without damage. Further discussion of these and other examples are also contemplated without departing from the spirit and scope thereof.

Example Procedures

The following discussion describes touch display module support techniques that may be implemented utilizing the previously described systems and devices. Aspects of each of the procedures may be implemented in hardware, firmware, or software, or a combination thereof. The procedures are shown as a set of blocks that specify operations performed by one or more devices and are not necessarily limited to the orders shown for performing the operations by the respective blocks. In portions of the following discussion, reference will be made to the figures described above.

Functionality, features, and concepts described in relation to the examples of FIGS. 1-9 may be employed in the context of the procedures described herein. Further, functionality, features, and concepts described in relation to different procedures below may be interchanged among the different procedures and are not limited to implementation in the context of an individual procedure. Moreover, blocks associated with different representative procedures and corresponding figures herein may be applied together and/or combined in different ways. Thus, individual functionality, features, and concepts described in relation to different example environments, devices, components, and procedures herein may be used in any suitable combinations and are not limited to the particular combinations represented by the enumerated examples.

FIG. 10 depicts a procedure 1000 in an example implementation in which an apparatus that includes a touch display module 112 and a support 122 is assembled within an external enclosure 120 as part of manufacture of a computing device 102. An apparatus is received that includes a support and a touch display module. The touch display module includes a touch panel assembly having one or more touch sensors and a display module to output a display through at least a portion of the touch panel assembly. The support is secured to the touch display module using a connection that is not reworkable (block 1002). As shown in FIG. 2, for instance, a touch panel assembly 208 may be optically bonded to a display module 210 to form a touch display module 112. The touch display module 112 may then be secured to a support 122 using a connection 218 that is not reworkable without damaging the touch display module 112.

The support of the apparatus is then secured within a cavity of an external enclosure using a reworkable connection (block 1004). A variety of different reworkable connections may be employed, such as through use of reworkable adhesives, mechanical connections, magnets, and so on as shown in FIGS. 3-9.

CONCLUSION

Although the invention has been described in language specific to structural features and/or methodological acts, it is to be understood that the invention defined in the appended claims is not necessarily limited to the specific features or acts described. Rather, the specific features and acts are disclosed as example forms of implementing the claimed invention.

What is claimed is:

1. An apparatus comprising:
an external enclosure comprising interior sidewalls and a bottom surface, the interior sidewalls and the bottom surface defining a cavity;
a touch panel assembly positioned within the cavity of the external enclosure, the touch panel assembly having an outer surface and an inner surface;
a display module positioned within the cavity; and
a support extending vertically from the bottom surface of the external enclosure to the inner surface of the touch panel assembly, a first end of the support secured to the inner surface of the touch panel assembly with a non-reworkable adhesive connection and a second end of the support secured to the bottom surface of the external enclosure with a reworkable adhesive connection,
wherein the first end of the support has a first width and the second end of the support has a second width that is relatively greater than the first width,
wherein the touch panel assembly and the support are removable together from the external enclosure by applying heat to the reworkable adhesive connection between the second end of the support and the bottom surface of the external enclosure, and
wherein the support does not contact the display module.

2. The apparatus of claim 1, wherein the reworkable adhesive connection uses reworkable pressure sensitive adhesive and the non-reworkable adhesive connection uses permanent pressure sensitive adhesive.

3. The apparatus of claim 1, wherein the touch panel assembly comprises protective glass positioned over multiple touch sensors.

4. The apparatus of claim 3, wherein:
the support comprises a ring encircling the display module,
the first end of the support makes substantially continuous contact with the touch panel assembly, and
the second end of the support makes substantially continuous contact with the bottom surface of the external enclosure.

5. The apparatus of claim 4, wherein the support contacts the interior sidewalls of the external enclosure.

6. The apparatus of claim 5, further comprising:
a display housing, the display module being secured to the display housing, the display housing having a side portion along a corresponding side portion of the display module and a lower portion arranged underneath the display module.

7. The apparatus of claim 6, wherein the support does not contact the display housing.

8. The apparatus of claim 7, wherein the second end of the support extends partially underneath the display housing.

9. A device comprising:
an external enclosure having interior sidewalls and a bottom surface, the interior sidewalls and the bottom surface defining a cavity;
a touch panel assembly positioned within the cavity of the external enclosure, the touch panel assembly having an outer surface and an inner surface;
a display module optically bonded to the touch panel assembly; and
a support extending vertically from the bottom surface of the external enclosure to the inner surface of the touch panel assembly, a first end of the support secured to the inner surface of the touch panel assembly with a non-reworkable adhesive connection and a second end of the support secured to the interior sidewalls of the external enclosure with a reworkable adhesive connection,
wherein the touch panel assembly and the support are removable together from the external enclosure by applying heat to the reworkable adhesive connection between the second end of the support and the interior sidewalls of the cavity of the external enclosure, and
wherein the support does not contact the display module.

10. The device of claim 9,
wherein:
the support comprises a ring encircling the display module,
the first end of the support makes substantially continuous contact with the touch panel assembly, and
the second end of the support makes substantially continuous contact with the interior sidewalls of the external enclosure.

11. The device of claim 10, wherein the second end of the support is also secured to the bottom surface of the external enclosure with the reworkable adhesive connection.

12. The device of claim 11, wherein the second end of the support makes substantially continuous contact with the bottom surface of the external enclosure.

13. The device of claim 12, further comprising a display housing, the display module being secured to the display housing, the display housing having a side portion along a corresponding side portion of the display module and a lower portion arranged underneath the display module.

14. The device of claim 13, wherein the second end of the support does not extend underneath the display housing.

15. The device of claim 14, wherein the support does not contact the display housing.

16. An apparatus comprising:
an external enclosure comprising interior sidewalls and a bottom surface, the interior sidewalls and the bottom surface defining a cavity;
a touch panel assembly positioned within the cavity of the external enclosure, the touch panel assembly having an outer surface and an inner surface;
a display module positioned under the touch panel assembly; and
a support extending vertically from the bottom surface of the external enclosure to the inner surface of the touch panel assembly, a first end of the support secured to the inner surface of the touch panel assembly with a non-reworkable adhesive connection and a second end of the support secured to the bottom surface of the external enclosure with a reworkable adhesive connection,
wherein the touch panel assembly and the support are removable together from the external enclosure by applying heat to the reworkable adhesive connection between the second end of the support and the bottom surface of the external enclosure, and
wherein the support does not contact the display module.

17. The apparatus of claim 16,
wherein:
the support comprises a ring encircling the display module,
the first end of the support makes substantially continuous contact with the touch panel assembly, the second end of the support makes substantially continuous contact with the bottom surface of the external enclosure and the interior sidewalls of the external enclosure, and the reworkable adhesive connection secures the second end of the support to the interior sidewalls.

18. The apparatus of claim 17, further comprising:

a display housing, the display module being secured to the display housing, the display housing having a side portion along a corresponding side portion of the display module and a lower portion arranged underneath the display module.

19. The apparatus of claim 18, wherein an inner edge of the external enclosure defines a first perimeter, an outer edge of the display housing defines a second perimeter, and the non-reworkable adhesive connection is provided along the ring between the first perimeter and the second perimeter.

20. The apparatus of claim 19, wherein the support does not contact the display housing.

\* \* \* \* \*